United States Patent US010176972B2

(12) United States Patent
Watanabe et al.

(10) Patent No.: US 10,176,972 B2
(45) Date of Patent: Jan. 8, 2019

(54) PLASMA ETCHING APPARATUS COMPRISING A NOZZLE OSCILLATING UNIT

(71) Applicant: DISCO CORPORATION, Tokyo (JP)

(72) Inventors: Yoshio Watanabe, Tokyo (JP); Siry Milan, Tokyo (JP); Hiroyuki Takahashi, Tokyo (JP); Takeshi Seki, Tokyo (JP)

(73) Assignee: DISCO Corporation, Tokyo (JP)

( * ) Notice: Subject to any disclaimer, the term of this patent is extended or adjusted under 35 U.S.C. 154(b) by 428 days.

(21) Appl. No.: 15/151,072

(22) Filed: May 10, 2016

(65) Prior Publication Data

US 2016/0343544 A1 Nov. 24, 2016

(30) Foreign Application Priority Data

May 20, 2015 (JP) .................. 2015-102921

(51) Int. Cl.
*H01J 37/32* (2006.01)
(52) U.S. Cl.
CPC .... *H01J 37/3244* (2013.01); *H01J 37/32357* (2013.01); *H01J 37/32541* (2013.01); *H01J 37/32834* (2013.01); *H01J 2237/334* (2013.01)
(58) Field of Classification Search
CPC .. H01J 37/32; H01J 37/32431; H01J 37/3244; H01J 37/32351; H01J 37/32541; H01J 37/32834; H01J 2237/334; C30B 25/00; C30B 25/02; C30B 25/14; C30B 25/16

USPC .............. 156/345.1, 345.24, 345.29, 345.33, 156/345.35, 345.39, 345.41, 345.43, 156/345.48, 345.51, 345.54; 118/715, 118/720, 722

See application file for complete search history.

(56) References Cited

U.S. PATENT DOCUMENTS 7,297,286 B2* 11/2007 Tannous .................... B08B 5/02
134/1.1
2009/0241995 A1* 10/2009 Somervell ................. G03F 7/42
134/30

FOREIGN PATENT DOCUMENTS

JP 2000-353676 12/2000

* cited by examiner

*Primary Examiner* — Kenneth A Bratland, Jr.
(74) *Attorney, Agent, or Firm* — Greer Burns & Crain, Ltd.

(57) ABSTRACT

A plasma etching apparatus includes: a vacuum chamber; a rotatable electrostatic chuck table for holding a workpiece in the vacuum chamber; a nozzle for supplying a plasma etching gas to part of the workpiece held on the electrostatic chuck table; a nozzle oscillating unit for oscillating the nozzle in such a manner as to describe a horizontal arcuate locus between a region corresponding to the center of the electrostatic chuck table and a region corresponding to the outer periphery of the electrostatic chuck table; and a control unit that controls the rotation amount of the electrostatic chuck table and the position of the nozzle to thereby position the nozzle into a region corresponding to an arbitrary part of the workpiece held on the electrostatic chuck table.

4 Claims, 4 Drawing Sheets

PLASMA ETCHING APPARATUS COMPRISING A NOZZLE OSCILLATING UNIT

BACKGROUND OF THE INVENTION

Field of the Invention

The present invention relates to a plasma etching apparatus by which a plate-shaped workpiece can be processed.

Description of the Related Art

In electronic apparatuses represented by mobile phones and personal computers, device chips provided with electronic circuits are indispensable components. A device chip can be produced, for example, by a method wherein a front surface of a wafer formed from a semiconductor material such as silicon is partitioned into a plurality of regions by a plurality of division lines (streets), then an electronic circuit is formed in each of the regions, and the wafer is divided along the streets.

In recent years, for such purposes as reducing the device chips in size and weight, the wafers after the formation of the electronic circuits have come to be more often thinned by grinding or the like. If a wafer is thinned by grinding, however, strains due to grinding (grinding strains) would be left in the ground surface, lowering the deflective strength of the device chips. Taking this problem into account, the grinding strains are often removed by such a method as plasma etching, after the grinding of the wafer (see, for example, Japanese Patent Laid-Open No. 2000-353676).

SUMMARY OF THE INVENTION

A plasma etching apparatus used for removing the grinding strains as above-mentioned, normally, includes a vacuum chamber in which a pair of flat plate-shaped electrodes are disposed in parallel to each other. A wafer can be processed, for example, by a method wherein the vacuum chamber is evacuated with the wafer disposed between electrodes, and a high-frequency voltage is impressed on the electrodes while supplying a gas or gases as raw material for plasma, thereby to generate a plasma and process the wafer.

In this plasma etching apparatus, however, the plasma generated acts on the whole surface of the wafer, and, therefore, it is impossible just in this condition to selectively process a part of the wafer. In the case of for example selectively processing only the wafer parts where grinding strains are left, therefore, it has been necessary to form a mask for protecting the other wafer parts.

Accordingly, it is an object of the present invention to provide a plasma etching apparatus by which part of a workpiece can be selectively processed.

In accordance with an aspect of the present invention, there is provided a plasma etching apparatus including a vacuum chamber, a rotatable electrostatic chuck table for holding a workpiece in the vacuum chamber, a nozzle for supplying a plasma etching gas to part of the workpiece held on the electrostatic chuck table, a nozzle oscillating unit for oscillating the nozzle in such a manner as to describe a horizontal arcuate locus between a region corresponding to a center of the electrostatic chuck table and a region corresponding to an outer periphery of the electrostatic chuck table, and a control unit that controls rotation amount of the electrostatic chuck table and position of the nozzle to thereby position the nozzle into a region corresponding to an arbitrary part of the workpiece held on the electrostatic chuck table.

In an aspect of the present invention, preferably, an inner gas is supplied into the vacuum chamber.

In another aspect of the present invention, preferably, the nozzle includes a jet port for jetting the plasma etching gas, and an exhaust port for exhausting the plasma etching gas, the exhaust port being formed around the jet port.

In a further aspect of the present invention, the nozzle jets the plasma etching gas in a radicalized or ionized state.

The plasma etching apparatus according to the described aspects of the present invention includes the nozzle for supplying the plasma etching gas to part of the workpiece held on the electrostatic chuck table, the nozzle oscillating unit for oscillating the nozzle in such a manner as to describe a horizontal arcuate locus between a region corresponding to the center of the electrostatic chuck table and a region corresponding to the outer periphery of the electrostatic chuck table, and the control unit for controlling rotation amount of the electrostatic chuck table and position of the nozzle to thereby position the nozzle into a region corresponding to an arbitrary part of the workpiece held on the electrostatic chuck table. Therefore, the plasma etching gas can be supplied to an arbitrary part of the workpiece. In other words, it is possible according to the present invention to provide a plasma etching apparatus by which part of a workpiece can be selectively processed.

The above and other objects, features and advantages of the present invention and the manner of realizing them will become apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
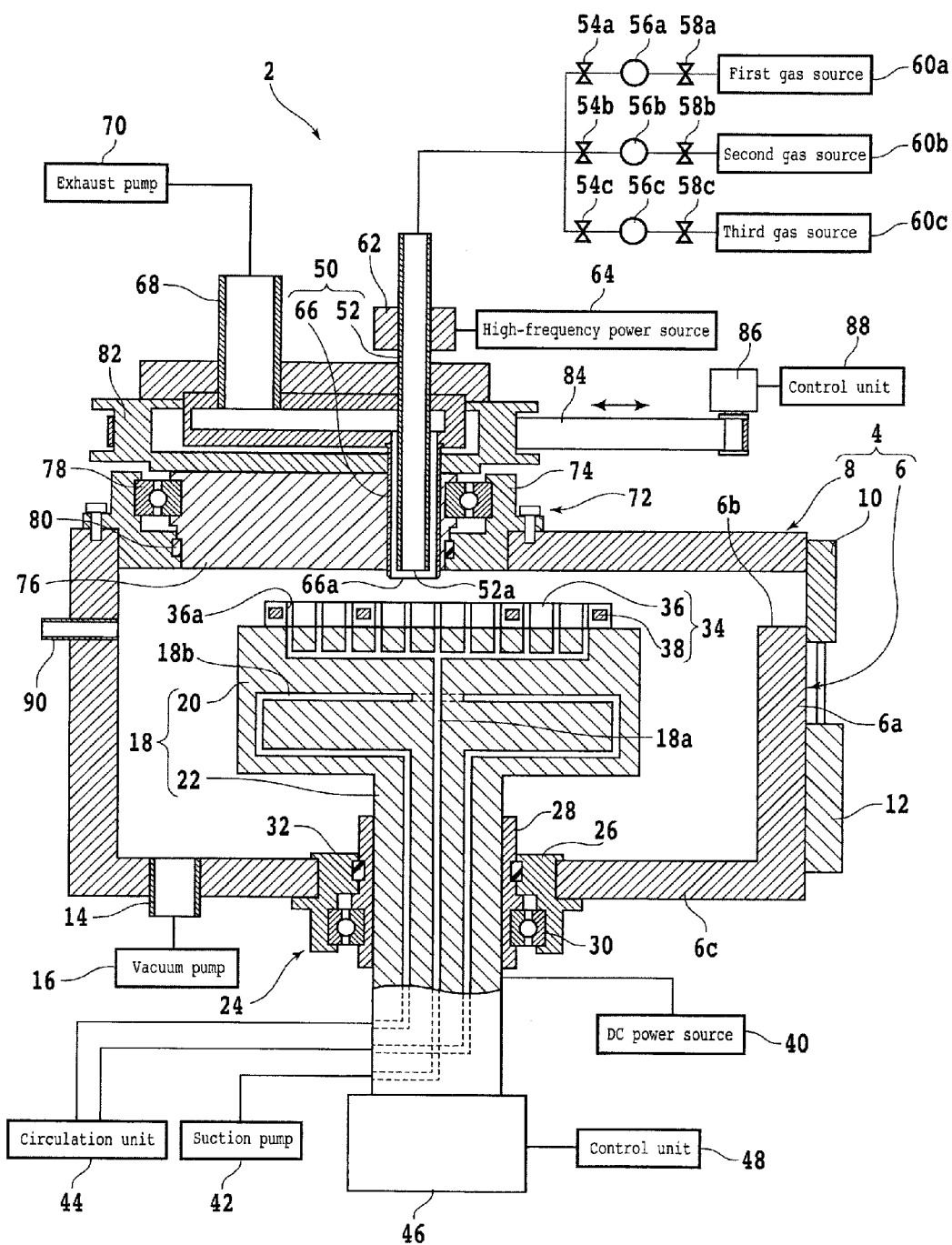
FIG. 1 schematically illustrates a configuration example of a plasma etching apparatus.
Figure 2:
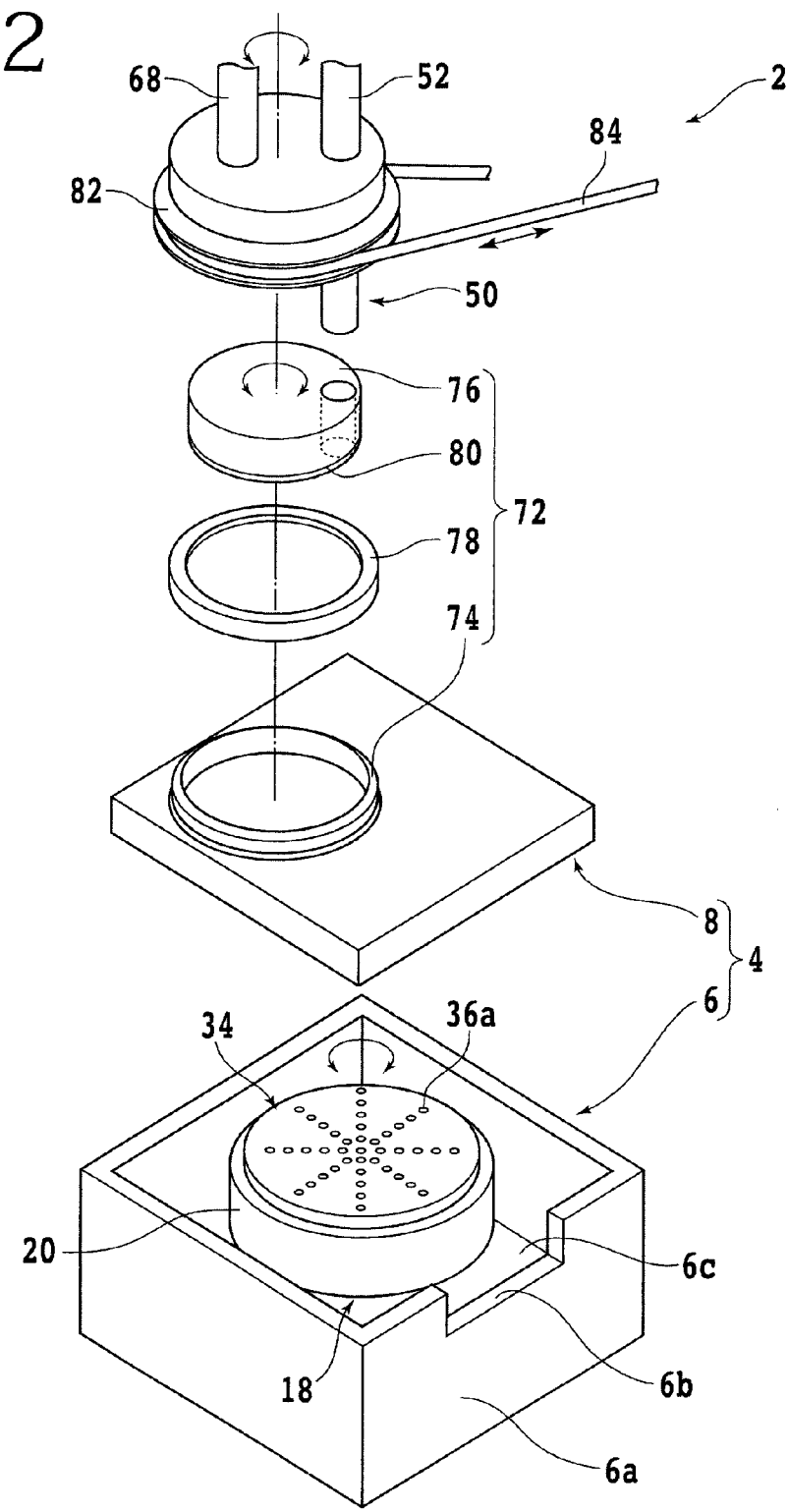
FIG. 2 is an exploded perspective view schematically illustrating a configuration example of the plasma etching apparatus.

An embodiment of the present invention will be described referring to the attached drawings. FIG. 1 schematically illustrates a configuration example of a plasma etching apparatus according to the present embodiment, and FIG. 2 is an exploded perspective view schematically showing a configuration example of the plasma etching apparatus. Note that in FIG. 2, part of components is omitted, for convenience of explanation.

As illustrated in FIGS. 1 and 2, a plasma etching apparatus 2 according to the present embodiment includes a vacuum chamber 4 that defines a treatment space. The vacuum chamber 4 includes a box-shaped main body 6, and a lid 8 closing an upper portion of the main body 6. A side wall 6a of the main body 6 is formed at a part thereof with an opening part 6b for feeding in and out a plate-shaped workpiece 11 (see FIG. 4).

Typically, the workpiece 11 is a disk-shaped wafer formed of a semiconductor material such as silicon. A front surface of the workpiece 11 is, for example, partitioned into a plurality of regions by division lines (streets) arranged in a crossing manner, and an electronic circuit called IC, LSI or the like is formed in each of the regions. Note that while a disk-shaped wafer formed of a semiconductor material such as silicon is used as the workpiece 11 in the present embodiment, the workpiece 11 is not limited in regard of material, shape or the like. For example, a substrate of such a material as ceramic, resin, or metal can also be used as the workpiece 11.

On the outside of the side wall 6a is disposed a gate 10 for closing the opening part 6b. Under the gate 10 is provided an opening/closing unit 12 that includes a cylinder or the like. The gate 10 is moved vertically by the opening/closing unit 12. When the gate 10 is moved downward by the opening/closing unit 12 and the opening part 6b is thereby exposed, the workpiece 11 can be fed into or fed out from the treatment space via the opening part 6b. To a bottom wall 6c of the main body 6, a vacuum pump 16 is connected through a piping 14 or the like. At the time of processing the workpiece 11, the gate 10 is moved upward by the opening/closing unit 12 to close the opening part 6b, and thereafter the treatment space is evacuated by the vacuum pump 16.

A table base 18 for supporting the workpiece 11 is disposed in the treatment space. The table base 18 includes a disk-shaped holding part 20, and a columnar shaft part 22 extending downward from the center of a lower surface of the holding part 20. A support unit 24 by which the shaft part 22 of the table base 18 is rotatably supported is provided at a central portion of the bottom wall 6c. The support unit 24 includes a cylindrical stationary member 26 fixed to a central portion of the bottom wall 6c. On the inside of the stationary member 26, a cylindrical rotation member 28 fixed to the shaft part 22 is disposed. The rotation member 28 is connected to the stationary member 26 through a radial bearing 30. A ring-shaped lip seal 32 is provided on the treatment space side of the radial bearing 30. As the lip seal 32, there can be used, for example, OmniSeal (registered trademark) available from Saint-Gobain K.K. Owing to the lip seal 32, the table base 18 can be rotated while maintaining the gas-tightness of the treatment space.

On the upper side of the holding part 20 is provided a disk-shaped electrostatic chuck table 34. The electrostatic chuck table 34 includes a main body 36 formed from an insulating material, and a plurality of electrodes 38 embedded in the main body 36, and attraction holds the workpiece 11 by static electricity generated between the electrodes 38. The electrodes 38 are each connected to a DC power source 40 capable of generating a high voltage of approximately 5 kV, for example. In addition, the main body 36 of the electrostatic chuck table 34 is formed therein with suction passages 36a for suction holding the workpiece 11. The suction passages 36a are connected to a suction pump 42 via a suction passage 18a or the like formed in the inside of the table base 18. At the time of holding the workpiece 11 by the electrostatic chuck table 34, first, the workpiece 11 is placed on the upper surface of the electrostatic chuck table 34 and the suction pump 42 is operated. As a result, the workpiece 11 is put in close contact with the upper surface of the electrostatic chuck table 34 by a suction force of the suction pump 42. When a potential difference is generated between the electrodes 38 in this condition, the workpiece 11 can be attraction held by the static electricity.

In addition, the table base 18 is formed therein with a cooling flow path 18b. Both ends of the cooling flow path 18b are connected to a circulation unit 44 for circulating a coolant. When the circulation unit 44 is operated, the coolant flows from one end toward the other end of the cooling flow path 18b, whereby the table base 18 and the like are cooled. A rotational drive unit 46 such as a motor is connected to a lower end of the shaft part 22. The table base 18 and the electrostatic chuck table 34 are rotated by a rotating force of the rotational drive unit 46. The rotational drive unit 46 is connected with a control unit (control means) 48, by which rotational amount (rotational angle) of the table base 18 and the electrostatic chuck table 34 is controlled.

On the upper side of the electrostatic chuck table 34 is disposed a nozzle unit (nozzle) 50 for supplying a plasma (a plasma etching gas) to the workpiece 11. The nozzle unit 50 includes a cylindrical first nozzle 52 for jetting the plasma. To an upstream end of the first nozzle 52, a plurality of gas sources are connected in parallel. Specifically, for example, a first gas source 60a for supplying $SF_6$ is connected to the upstream end via a valve 54a, a flow rate controller 56a, a valve 58a and the like, a second gas source 60b for supplying $O_2$ is connected to the upstream end via a valve 54b, a flow rate controller 56b, a valve 58b and the like, and a third gas source 60c for supplying an inert gas is connected to the upstream end via a valve 54c, a flow rate controller 56c, a valve 58c and the like. By this configuration, a mixed gas obtained by mixing a plurality of gases in a desired flow rate ratio can be supplied to the first nozzle 52. At a middle stream portion of the first nozzle 52 is disposed an electrode 62 for generating the plasma. Besides, the electrode 62 is connected with a high-frequency power source 64. The high-frequency power source 64 supplies the electrode 62 with a high-frequency voltage of, for example, approximately 0.5 kV to 5 kV and approximately 450 kHz to 2.45 GHz. When a high-frequency voltage is supplied to the electrode 62 while supplying the mixed gas as material for plasma, the mixed gas can be radicalized or ionized and a plasma can be generated in the inside of the nozzle 52. The plasma thus produced is jetted from a jet port 52a formed at a downstream end of the first nozzle 52. Note that the number of the gas sources and the kinds of the gases can be arbitrarily changed according to the kind of the workpiece 11 and the like. In addition, the flow rate ratio of the gases is appropriately set within such a range that a plasma can be produced.

A cylindrical second nozzle 66 larger than the first nozzle 52 in diameter is disposed in the manner of surrounding a downstream side of the first nozzle 52. An upstream side of the second nozzle 66 is connected to an exhaust pump 70 through an exhaust unit 68 provided therein with an exhaust path. On the other hand, a downstream end of the second nozzle 66 is located below the jet port 52a of the first nozzle 52, to serve as an exhaust port 66a through which the plasma jetted from the jet port 52a and the like are exhausted to the exterior. The lid 8 is provided with a support unit 72 for supporting the nozzle unit 50 including the first nozzle 52 and the second nozzle 66. The support unit 72 includes a cylindrical stationary member 74 fixed to the lid 8. On the inside of the stationary member 74 is disposed a cylindrical columnar rotation member 76 for fixing the nozzle unit 50. The rotation member 76 is connected to the stationary member 74 through a radial bearing 78. A ring-shaped lip seal 80 configured similarly to the lip seal 32 is provided on the treatment space side of the radial bearing 78. Owing to the lip seal 80, the rotation member 76 can be rotated while maintaining the gas-tightness of the treatment space.

A disk-shaped pulley member 82 is fixed to an upper portion of the rotation member 76. The pulley member 82 is connected to a rotational drive unit (nozzle oscillating unit or nozzle oscillating means) 86, such as a motor, through a belt 84. The rotation member 76 is rotated by a rotating force of the rotational drive unit 86 that is transmitted through the pulley member 82 and the belt 84. The rotational drive unit 86 is connected with a control unit (control means) 88, by which rotation amount (rotational angle) of the rotation member 76 is controlled. With the rotation amount of the rotation member 76 controlled by the control unit 88, the nozzle unit 50 can be oscillated in such a manner as to describe a horizontal arcuate locus. Therefore, where the rotation amount of the electrostatic chuck table 34 is controlled by the aforementioned control unit 48 and the position of the nozzle unit 50 is controlled by the control unit 88, the positional relation between the workpiece 11 and the nozzle unit 50 can be thereby freely adjusted. Note that the rotational drive unit 46 and the rotational drive unit 86 are controlled by the different control units 48 and 88 in the present embodiment, the rotational drive unit 46 and the rotational drive unit 86 may be controlled by the same control unit (control means). A piping 90 is provided at another part of the side wall 6a of the main body 6. The piping 90 is connected to the third gas source 60c by way of a valve (not shown), a flow rate controller (not shown) and the like. The inert gas supplied from the third gas source 60c through the piping 90 serves as an inner gas for filling up the treatment space of the vacuum chamber 4.

An example of the procedure of processing the workpiece 11 by use of the aforementioned plasma etching apparatus 2 will be described. First, the gate 10 is lowered by the opening/closing unit 12. Next, the workpiece 11 is fed into the treatment space of the vacuum chamber 4 via the opening part 6b, and the workpiece 11 is placed on the upper surface of the electrostatic chuck table 34 in such a manner that a work surface to be processed by plasma etching is exposed to the upper side. Thereafter, the suction pump 42 is operated, to bring the workpiece 11 into close contact with the electrostatic chuck table 34. Then, a potential difference is generated between the electrodes 38, whereby the workpiece 11 is attraction held by static electricity. In addition, the gate 10 is raised by the opening/closing unit 12 to close the opening part 6b, and the treatment space is evacuated by the vacuum pump 16. After the treatment space is evacuated to approximately 200 Pa, for example, the treatment space is filled up with the inert gas supplied from the third gas source 60c via the piping 90. Note that as the inner gas for filling up the treatment space, there can be used a rare gas such as Ar, He, etc. or a mixed gas of a rare gas with $N_2$, $H_2$ or the like. Besides, by controlling the rotation amount of the electrostatic chuck table 34 and the position of the nozzle unit 50, the positional relation between the workpiece 11 and the nozzle unit 50 is adjusted.

Figure 3A:
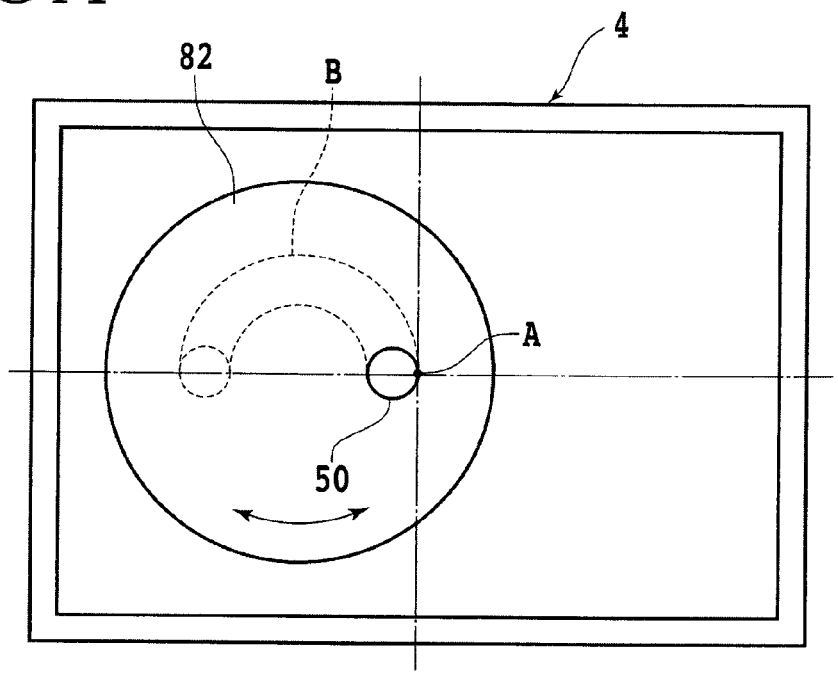
FIG. 3A is a plan view schematically showing the manner in which the position of a nozzle unit is controlled.
Figure 3B:
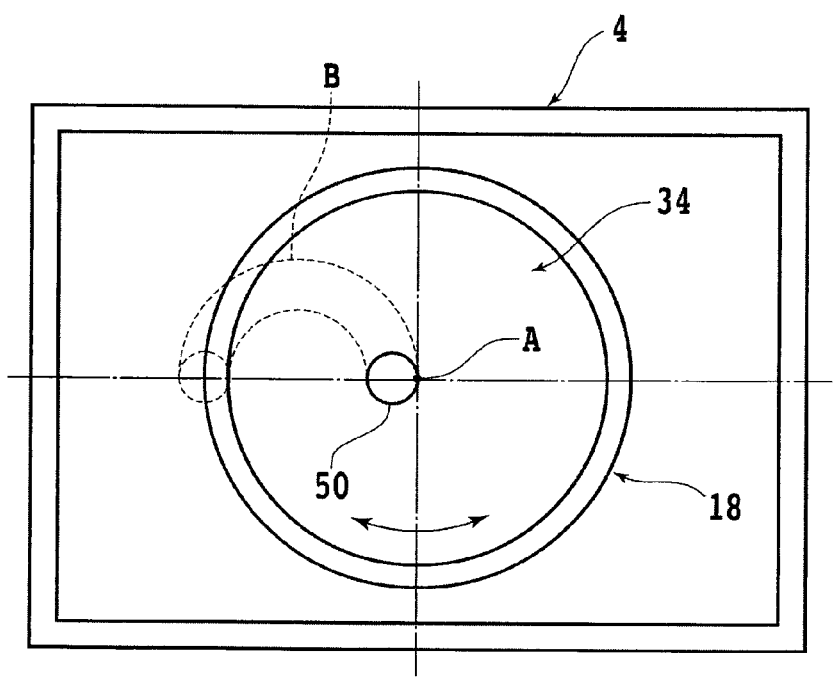
FIG. 3B is a plan view schematically showing the manner in which the rotation amount of an electrostatic chuck table is controlled.

FIG. 3A is a plan view schematically illustrating the manner in which the position of the nozzle unit 50 is controlled, and FIG. 3B is a plan view schematically illustrating the manner in which the rotation amount of the electrostatic chuck table 34 is controlled. Note that in FIGS. 3A and 3B, a center A of rotation of the electrostatic chuck table 34 and a locus B of the nozzle unit 50 are shown in an adjusted state. As depicted in FIGS. 3A and 3B, the nozzle unit 50 is oscillated in such a manner as to describe a horizontal arcuate locus between a region corresponding to the center A of the electrostatic chuck table 34 and a region corresponding to the outer periphery of the electrostatic chuck table 34. In other words, the nozzle unit 50 can be moved to an arbitrary position in the radial direction of the electrostatic chuck table 34. Where the position of the nozzle unit 50 is regulated by the control unit 88 as shown in FIG. 3A and the rotation amount of the electrostatic chuck table 34 is regulated by the control unit 48 as shown in FIG. 3B, the nozzle unit 50 can thereby be adjusted to a region corresponding to an arbitrary part of the workpiece 11 held on the electrostatic chuck table 34.

Figure 4:
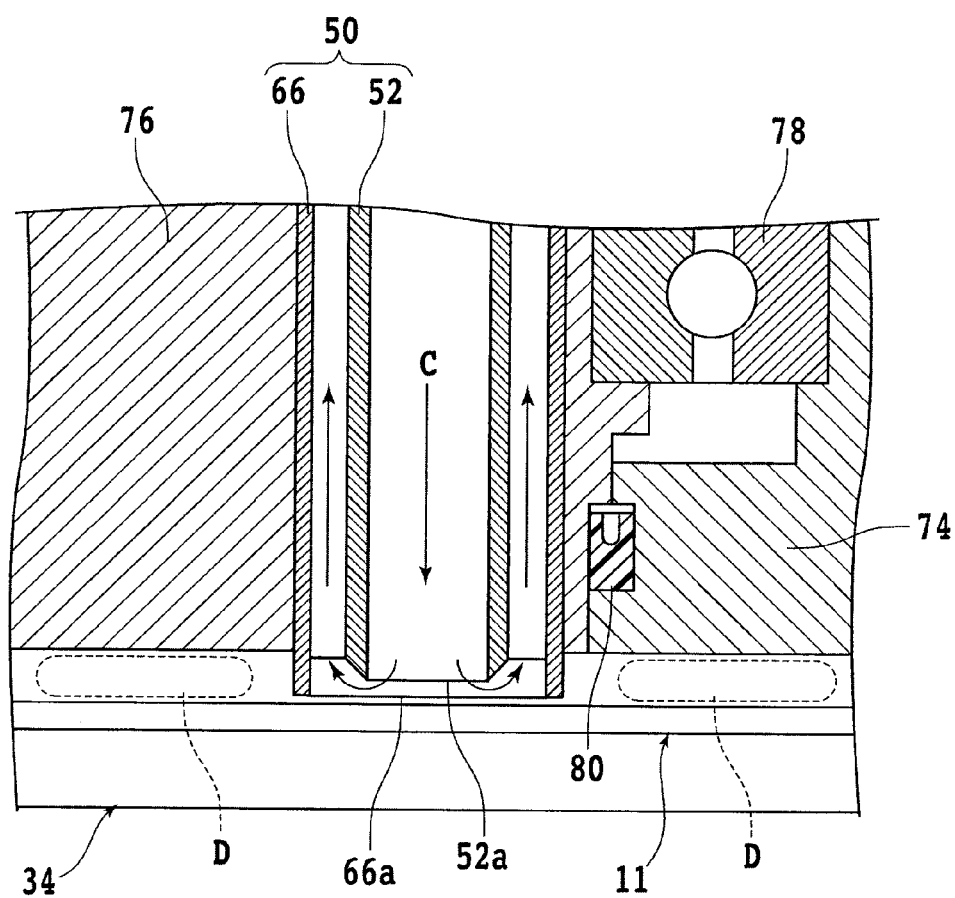
FIG. 4 is a partly sectional side view schematically showing the manner in which a workpiece is processed by a plasma supplied from the nozzle unit.

FIG. 4 is a partly sectional side view schematically illustrating the manner in which the workpiece 11 is processed by a plasma supplied from the nozzle unit 50. After the nozzle unit 50 is adjusted to a region corresponding to an arbitrary part of the workpiece 11, as shown in FIG. 4, $SF_6$, $O_2$, and an inert gas are supplied at arbitrary flow rates from the first gas source 60a, the second gas source 60b, and the third gas source 60c, respectively. In addition, a high-frequency voltage is supplied to the electrode 62, to radicalize or ionize the mixed gas of $SF_6$, $O_2$, and the inert gas. By this, it is possible to jet a plasma (plasma etching gas) C from the jet port 52a of the first nozzle 52 and thereby to process the workpiece 11 below. The plasma C jetted from the jet port 52a is sucked by the exhaust pump 70 through the exhaust port 66a, to be exhausted to the exterior of the treatment space.

As depicted in FIG. 4, the distance between the exhaust port 66a located at the lower end of the nozzle unit 50 and the work surface of the workpiece 11 is sufficiently small. Specifically, the distance is, for example, 0.1 mm to 10 mm, preferably 1 mm to 2 mm. In addition, the region on the outside of the nozzle unit 50 is filled with an inner gas D (inert gas). Therefore, there is no risk that the plasma C jetted from the jet port 52a might leak to the outside of the nozzle unit 50, processing an unintended part of the workpiece 11. In other words, the plasma C can be supplied only to an arbitrary part of the workpiece 11, thereby selectively processing the arbitrary part of the workpiece 11. In addition, in the plasma etching apparatus 2 according to the present embodiment, the positional relation between the electrostatic chuck table 34 and the nozzle unit 50 is controlled by a combination of two kinds of rotational motions. Therefore, it is easy to maintain the gas-tightness of the treatment space as compared, for example, to the case where the positional relation between the electrostatic chuck table 34 and the nozzle unit 50 is controlled by a rectilinear motion or motions. In other words, the positional relation between the workpiece 11 and the nozzle unit 50 can be adjusted while appropriately maintaining the gas-tightness of the treatment space.

As has been described above, the plasma etching apparatus 2 according to the present embodiment includes the nozzle unit (nozzle) 50 for supplying the plasma (plasma etching gas) C to part of the workpiece 11 held on the electrostatic chuck table 34, the rotational drive unit (nozzle oscillating unit or nozzle oscillating means) 86 for oscillating the nozzle unit 50 in such a manner as to describe a horizontal arcuate locus B between a region corresponding to a center A of the electrostatic chuck table 34 and a region corresponding to an outer periphery of the electrostatic chuck table 34, and the control units (control means) 48 and 88 for respectively controlling the rotation amount of the electrostatic chuck table 34 and the position of the nozzle unit 50 to thereby position the nozzle unit 50 into a region corresponding to an arbitrary part of the workpiece 11 held on the electrostatic chuck table 34. Accordingly, an arbitrary part of the workpiece 11 can be supplied with the plasma C and processed, by the plasma etching apparatus 2.

Note that the present invention is not limited to the above embodiment but can be carried out with various modifications. For instance, while the nozzle unit (nozzle) 50 is oscillated by use of the pulley member 82, the belt 84, the rotational drive unit (nozzle oscillating unit or nozzle oscillating means) 86 and the like in the above embodiment, the mechanism (nozzle oscillating unit or nozzle oscillating means) for oscillating the nozzle unit 50 is not restricted to these components. Besides, while the inner gas (inert gas) is supplied into the treatment space of the vacuum chamber 4 from the third gas source 60*c* by way of the piping 90 in the above embodiment, the inner gas can also be supplied from the third gas source 60*c* by way of the first nozzle 52.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A plasma etching apparatus comprising:
   a vacuum chamber;
   a rotatable electrostatic chuck table for holding a workpiece in the vacuum chamber;
   a nozzle for supplying a plasma etching gas to part of the workpiece held on the electrostatic chuck table;
   a nozzle oscillating unit for oscillating the nozzle in such a manner as to describe a horizontal arcuate locus between a region corresponding to a center of the electrostatic chuck table and a region corresponding to an outer periphery of the electrostatic chuck table; and
   a control unit that controls rotation amount of the electrostatic chuck table and position of the nozzle to thereby position the nozzle into a region corresponding to an arbitrary part of the workpiece held on the electrostatic chuck table.

2. The plasma etching apparatus according to claim 1, wherein an inner gas is supplied into the vacuum chamber.

3. The plasma etching apparatus according to claim 1, wherein the nozzle includes a jet port for jetting the plasma etching gas, and an exhaust port for exhausting the plasma etching gas, the exhaust port being formed around the jet port.

4. The plasma etching apparatus according to claim 1, wherein the nozzle jets the plasma etching gas in a radicalized or ionized state.

\* \* \* \* \*